(12) United States Patent
Annapragada

(10) Patent No.: US 6,218,735 B1
(45) Date of Patent: Apr. 17, 2001

(54) PROCESS TO IMPROVE ADHESION OF CAP LAYERS IN INTERGRATED CIRCUITS

(75) Inventor: Rao V. Annapragada, San Jose, CA (US)

(73) Assignee: Philips Semiconductor Inc., Sunnyvale, CA (US)

(*) Notice: Subject to any disclaimer, the term of this patent is extended or adjusted under 35 U.S.C. 154(b) by 0 days.

(21) Appl. No.: 09/439,021

(22) Filed: Nov. 12, 1999

Related U.S. Application Data

(62) Division of application No. 09/120,895, filed on Jul. 22, 1998, now Pat. No. 6,001,747.

(51) Int. Cl.[7] .......................... H01L 21/31; H01L 21/469
(52) U.S. Cl. .......................... 257/758; 257/759; 257/760
(58) Field of Search .................................. 257/758–9, 760

(56) References Cited

U.S. PATENT DOCUMENTS

| | | |
|---|---|---|
| 5,716,890 | 2/1998 | Yao . |
| 5,821,621 * | 10/1998 | Jeng ...................................... 257/758 |
| 5,872,065 | 2/1999 | Sivaramakrishnan . |
| 5,879,574 | 4/1999 | Sivaramakrishnan et al. . |
| 5,955,787 * | 9/1999 | Yu et al. .............................. 257/760 |
| 5,994,778 * | 11/1999 | Huang et al. ........................ 257/760 |
| 6,001,747 | 12/1999 | Annapragada . |
| 6,124,640 * | 9/2000 | Sahota et al. ........................ 257/760 |
| 6,133,619 * | 10/2000 | Sahota et al. ........................ 257/760 |

* cited by examiner

*Primary Examiner*—John F. Niebling
*Assistant Examiner*—Lynne A. Gurley
(74) *Attorney, Agent, or Firm*—Oppenheimer Wolff & Donnelly, LLP

(57) ABSTRACT

A method for making a multi-layered integrated circuit structure, includes depositing a methyl doped silicon oxide layer over a substrate. $SiO_2$ skin is deposited on the methyl doped silicon oxide layer by decreasing the flow of $CH_3SiH_3$, increasing the flow of $SiH_4$ and keeping the flow of $H_2O_2$ constant for a period of time. Finally, a cap layer is deposited which adheres to the $SiO_2$ skin.

26 Claims, 6 Drawing Sheets

PROCESS TO IMPROVE ADHESION OF CAP LAYERS IN INTERGRATED CIRCUITS

CROSS-REFERENCE TO RELATED APPLICATIONS

This application is a division of Ser. No. 09/120,895, filed Jul. 20, 1998, now U.S. Pat. No. 6,001,747. This application is related to the following U.S. patent application Ser. No. 09/121,180 filed on the same day herewith, incorporated herein by reference.

BACKGROUND OF THE INVENTION

1. Field of the Invention

The present invention relates generally to semiconductor manufacturing processes, and more particularly to techniques for improving the adhesion of a cap layer to an underlayer that includes methyl doped silicon oxide material that is vapor deposited.

2. Description of the Related Art

As semiconductor manufacturing technology produces devices that are faster and more efficient, both the density of conductive lines and the frequency of charges flowing on the conductive lines tend to increase. Because semiconductors rely on insulating (i.e. dielectric) layers to reduce capacitive coupling between the conductive lines, it has become increasingly important to have insulation that is able to accommodate both the higher operating frequencies and the shrinking distances between the lines.

FIG. 1A is a cross-sectional view illustrating the respective layers of a typical semiconductor structure 10. The semiconductor structure 10 is made up of several layers including a cap layer 12, a dielectric $SiO_2$ layer 14, and a semiconductor substrate 16. The semiconductor substrate 16 typically supports a first metal layer 18 formed into a number of conductive traces 18a, 18b, 18c and 18d.

A second metal layer 22 including traces 22a and 22b may be provided over the cap layer 12. A number of conductive vias, such as conductive via 20, are provided through the dielectric $SiO_2$ layer 14 and the cap layer 12, connecting the traces of metal layer 18 to traces of metal layer 22. For ease of illustration, only one conductive via 20 and six metal traces 18a–d and 22a–b are shown, but as is well known in the art, many more conductive vias and metal traces are used to provide appropriate connections in a semiconductor or integrated circuit device.

A first plurality of capacitive couplings 26 exist between the first metal layer 18 and the second metal layer 22. A second plurality of capacitive couplings 28 exist between the metal traces 18a–d. The purpose of the dielectric $SiO_2$ layer 14 is to insulate the metal traces and to reduce capacitive couplings 26 and 28.

With higher line density and higher operating frequencies, the coupling capacitances 26 and 28 are increasing to the point that dielectric $SiO_2$ layer 14 is a less than adequate insulator. Raising the operating frequency requires a reduction in both the first coupling capacitance 26 and the second coupling capacitance 28. Furthermore, increasing the densities of the metal traces 18a–d decreases the distance $d_1$ between each of the metal traces 18a–d which further increases the second capacitive coupling 28.

Another important dimension in FIG. 1A is the thickness $t_1$ of the dielectric $SiO_2$ layer 14. If the insulating material can be made thicker, the first coupling capacitance 26 can be reduced. Unfortunately, the dielectric $SiO_2$ layer 14 may have only a maximum thickness $t_1$ of about 3,000 Angstroms. If the dielectric layer thickness $t_1$ exceeds 3,000 Angstroms, the dielectric $SiO_2$ layer 14 will begin to crack and form rifts 30. Therefore, semiconductors need an alternative material that is both a better insulator (having a lower dielectric constant) and which resists cracking.

As illustrated in FIG. 1B, one way for improving the insulation of the semiconductor structure is to add methyl groups to the standard dielectric $SiO_2$ layer 14 in FIG. 1A to produce a methyl doped silicon oxide layer 34. Adding methyl groups lowers the dielectric constant of the methyl doped silicon oxide layer 34 to about 2.8. The methyl groups, which are added with a solvent free operation allows a thickness $t_2$ greater than 3,000 Angstroms (typically up to 10,000 Angstroms) without cracking.

Unfortunately, adding methyl groups to the dielectric layer can also cause the cap layer 12, which is added to protect the semiconductor structure, to peel away (as illustrated) during a subsequent chemical mechanical polishing (CMP) process used to planarize the cap layer. This is because the cap layer 12 doesn't adhere well to the methyl doped silicon oxide layer 34.

In view of the foregoing, it is desirable to have a method that provides for a low dielectric constant, low-cracking insulating material that adheres well to the cap layer all in the same semiconductor apparatus without adding significant time or cost to the process.

SUMMARY OF THE INVENTION

The present invention fills these needs by providing an efficient and economical method for improving adhesion of a cap oxide to a methyl doped silicon oxide material. It should be appreciated that the present invention can be implemented in numerous ways, including as a process, an apparatus, a system, a device or a method. Several inventive embodiments of the present invention are described below.

In one embodiment, a method for making a multi-layered integrated circuit structure is disclosed. This method includes: (a) depositing a methyl doped silicon oxide layer with a first thickness over a substrate under a first set of conditions; (b) depositing a $SiO_2$ skin with a second thickness on the methyl doped silicon oxide layer under a second set of conditions wherein the second thickness is substantially thinner than said :first thickness; and (c) depositing a cap layer adhering on the $SiO_2$ skin under a third set of conditions. The methyl doped silicon oxide is preferably $CH_3SiO_x$. In addition, the depositions are preferably performed in a same semiconductor apparatus.

In another embodiment, a method for making a multi-layered integrated circuit structure is disclosed. This method includes a second set of conditions comprising: (a) flowing $CH_3SiH_3$ into a semiconductor apparatus wherein the volume of $CH_3SiH_3$ is decreased over a period of time; (b) flowing $SiH_4$ into a semiconductor apparatus wherein the volume of $SiH_4$ is increased over said period of time; and (c) flowing $H_2O_2$ into the semiconductor apparatus wherein the volume of $H_2O_2$ is held constant over a period of time to produce a $SiO_2$ skin over the methyl doped silicon oxide layer. The period of time is preferably in the range of about 10–20 seconds.

An advantage of the present invention is that it improves adhesion between a methyl doped silicon oxide layer and a cap layer. Methyl doped silicon oxide material is an improvement over a standard dielectric material because it has a lower dielectric constant. Furthermore, methyl doped silicon oxide material can also be made much thicker than normal dielectric material because it resists cracking. Both of these factors allow the methyl doped silicon oxide layer to reduce inter-metal capacitance in the integrated circuit.

An additional advantage of the present invention is that it improves the adhesion of the methyl doped silicon oxide layer and the cap layer with minimal additional procedures, time and expense. Formation of the $SiO_2$ skin can be accomplished using the same semiconductor apparatus that is used to deposit both the methyl doped silicon oxide layer and the cap layer.

Therefore, the process of the present invention reduces the chance for contamination of the semiconductor wafer over a procedure that requires removal of the wafer from the semiconductor apparatus. Furthermore, the process of the present invention requires minimal additional cost and time because it can be completed in a few seconds between methyl doped silicon oxide layer and cap layer deposition.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. To facilitate this description, like reference numerals designate like structural elements.

DETAILED DESCRIPTION OF THE PREFERRED EMBODIMENTS

An invention for a method to improve adhesion of a cap layer to a methyl doped silicon oxide layer is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
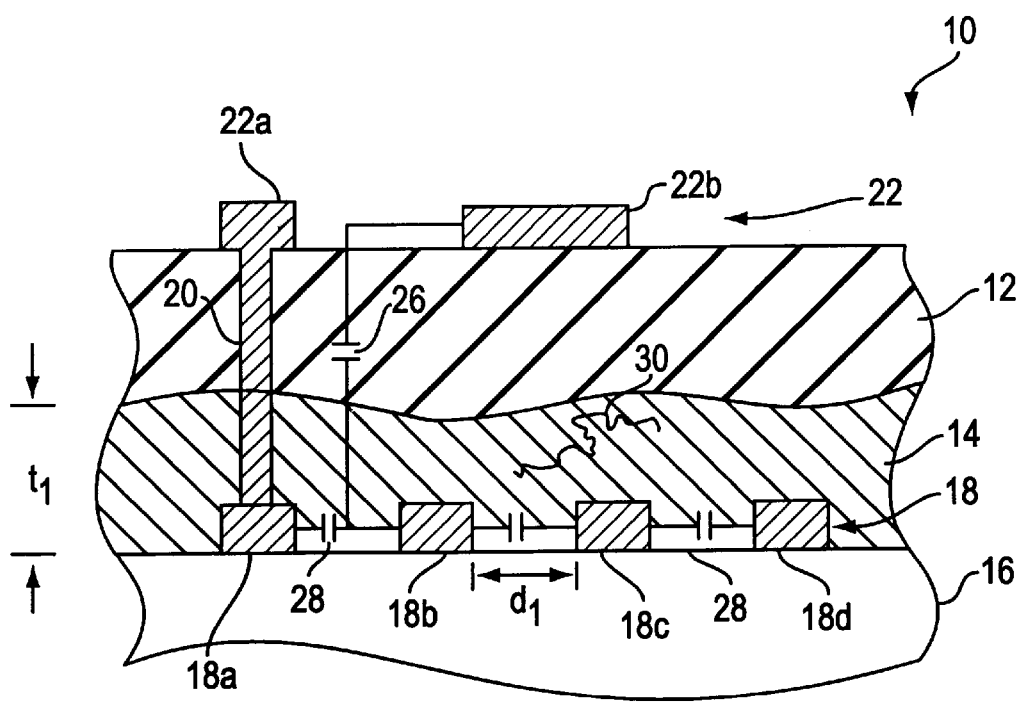
FIG. 1A is a cross-sectional view illustrating several layers of a prior art integrated circuit.
Figure 1B:
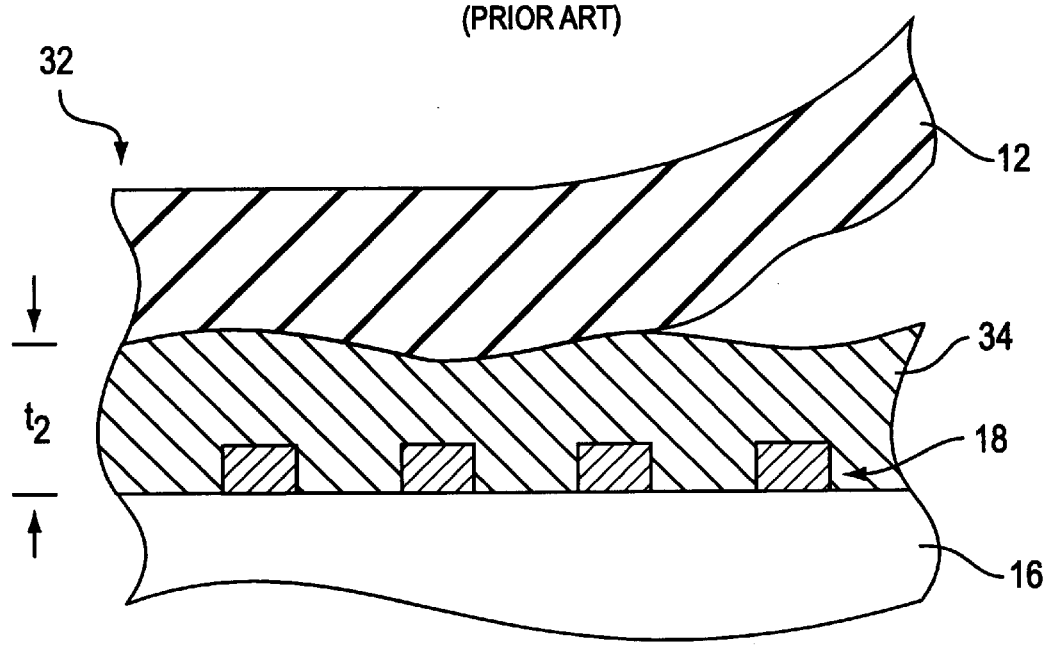
FIG. 1B is a cross-sectional view illustrating several layers of a prior art integrated circuit incorporating a methyl doped silicon oxide layer.
Figure 2:
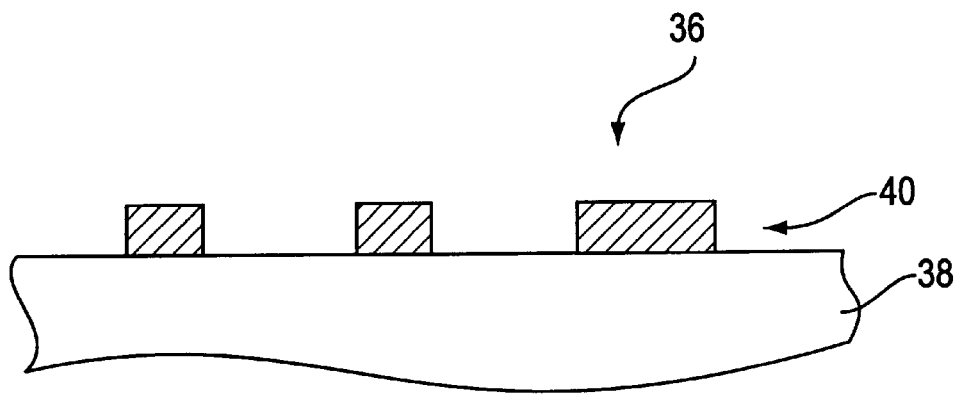
FIG. 2 is a cross-sectional view illustrating several layers of an integrated circuit being formed by a process in accordance with the present invention.
Figure 3A:
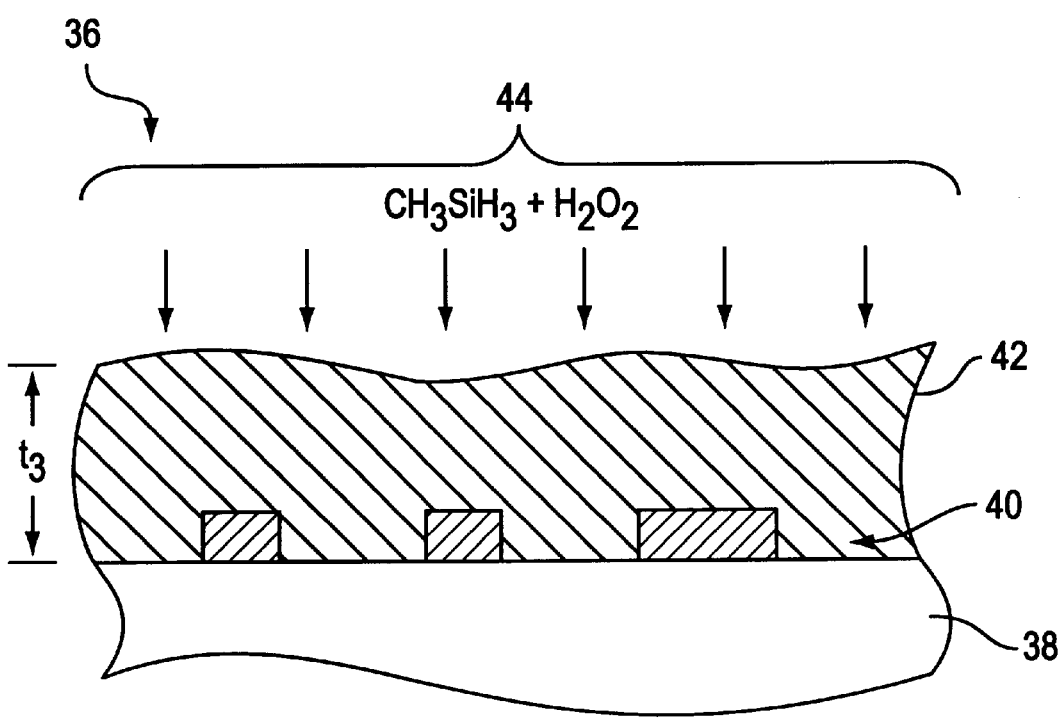
FIG. 3A is a cross-sectional view of the integrated circuit during methyl dielectric layer deposition.

FIGS. 1A and 1B were discussed with reference to the prior art. FIG. 2 is a cross-sectional view illustrating layers of an integrated circuit 36 being formed by a process in accordance with the present invention. In the beginning of the process, a metal layer 40 is deposited on top of a semiconductor substrate 38, and is then patterned. A methyl doped silicon oxide layer 42 is deposited on top of the metal layer 40 to act as an insulator as illustrated in FIG. 3A. The presence of the methyl groups reduces the dielectric constant of the methyl doped silicon oxide layer 42. In addition, the methyl groups, which are added in a solvent free operation, also add crack resistant characteristics to the material, as noted previously.

The methyl doped silicon oxide layer 42 is deposited in a semiconductor apparatus by mixing a gaseous combination of methyl silane ($CH_3SiH_3$) and hydrogen peroxide ($H_2O_2$) 44 which condense on top of the metal layer 40 in what is known as the Flowfill process. The methyl doped silicon oxide layer thickness $t_3$ is generally at least about 3,000 Angstroms. Preferably, the methyl doped silicon oxide layer 42 is composed of $CH_3SiO_x$ having a thickness $t_3$ is about 3,000 to about 10,000 Angstroms where x varies from about 1.5 to about 1.9. The percentage of methyl in the methyl doped silicon oxide layer 42 is about 10% to about 25%.

Figure 3B:
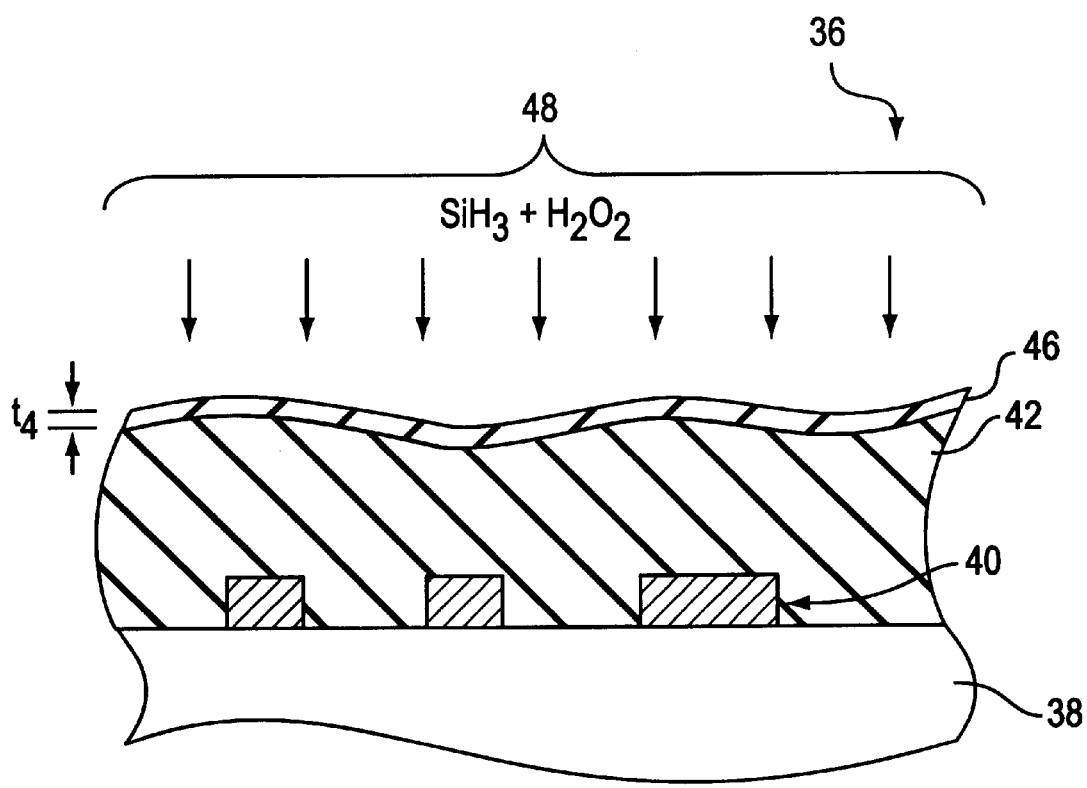
FIG. 3B is a cross-sectional view of the integrated circuit during the deposition of $SiO_2$ skin.
Figure 4:
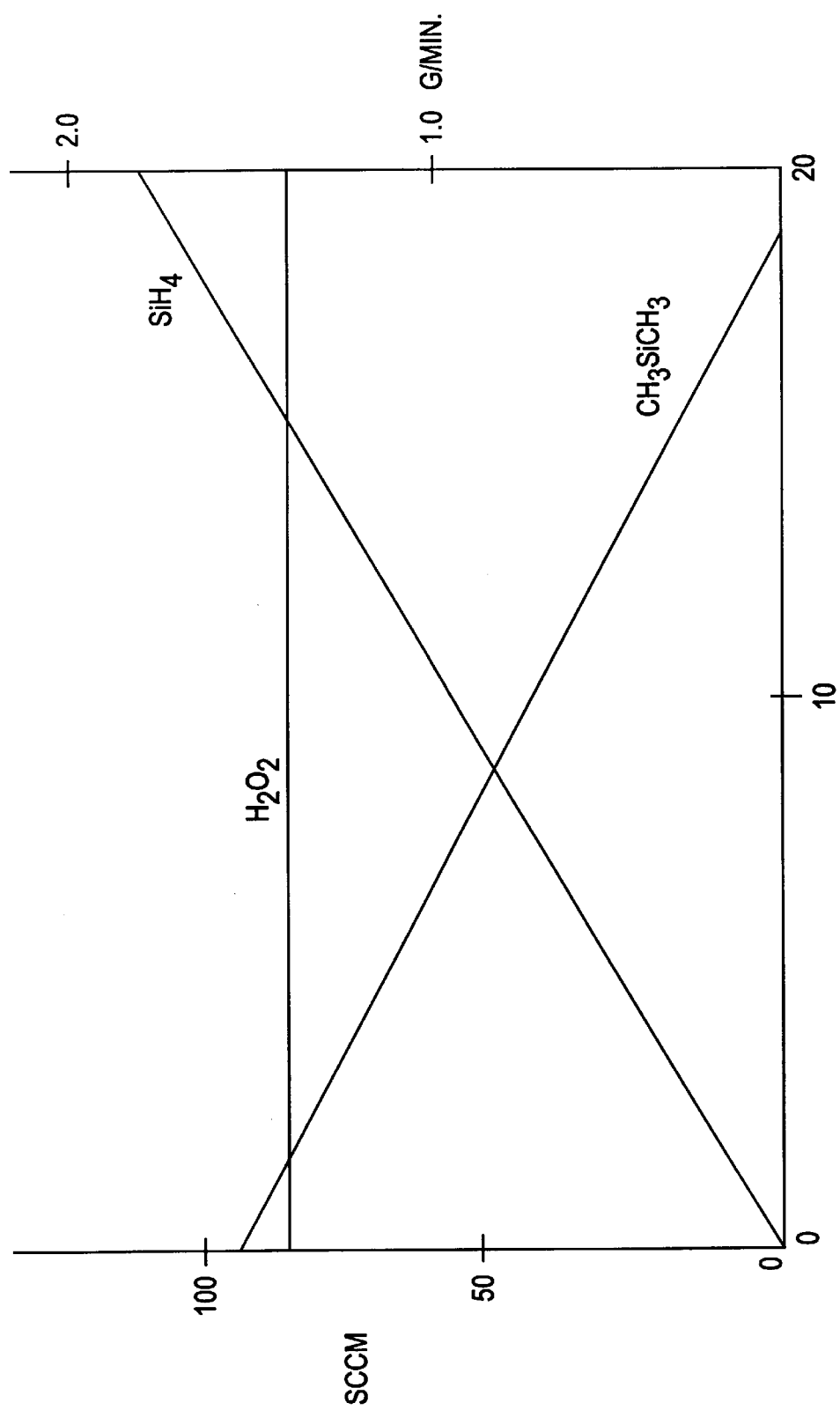
FIG. 4 is a graph of the relative volumes of $CH_3SiH_3$, $H_2O_2$ and $SiH_4$ being deposited during the period of time $SiO_2$ skin is being formed.

FIG. 3B is a cross-sectional view of the integrated circuit 36 during the deposition of a $SiO_2$ skin 46. By "skin" it is meant that a thin film or layer of $SiO_2$ is formed over the methyl doped silicon oxide layer 42. The integrated circuit 36 remains in the same semiconductor apparatus, which is preferably a cluster tool including a chemical vapor deposition (CVD) chamber. At the end of the operation that deposits the methyl doped silicon oxide layer 42, the volume of $CH_3SiH_3$ flowing over the integrated circuit 36 is decreased, and the volume of silane ($SiH_4$) is increased as shown in the graph ill FIG. 4 over a period of time. Also as shown in FIG. 4, the volume of $H_2O_2$ flowing onto the integrated circuit 36 remains constant.

The volume of $CH_3SiH_3$ flowing over the integrated circuit 36 is preferably decreased from around 100 standard cubic centimeters per minute (sccm) down to 20 sccm. The volume of $SiH_4$ is preferably increased from about 20 sccm to about 100 sccm. The volume of $H_2O_2$ flowing onto the integrated circuit 36 remains constant at about 0.3 grams/minute (g/min.) to about 1.5 g/min. The $SiO_2$ skin 46 is formed by a gaseous combination of $SiH_4$ and $H_2O_2$ 48 which then condenses on top of the methyl doped silicon oxide layer 42.

Because the thickness of the $SiO_2$ skin 46 is dependent upon the volume of the combination of $SiH_4$ and $H_2O_2$ 48 deposited, an optimal level of thickness can be achieved by operating the semiconductor apparatus for a short period of time. The semiconductor apparatus should be operated for between about 5 seconds and about 30 seconds, preferably between about 10 seconds and about 20 seconds, and most preferably about 15 seconds in the current example utilizing a low pressure CVD tool.

The CVD tool operates preferably from about 0.2 Torr to about 1.5 Torr. The methyl doped silicon oxide 42 should have a dielectric constant of between about 2.7 and about 3.0, and preferably a dielectric constant of 2.8. The $SiO_2$ skin thickness $t_4$ should be between about 50 to about 1,000 Angstroms, preferably about 200 to about 600 Angstroms, and optimally about 400 Angstroms.

Figure 5:
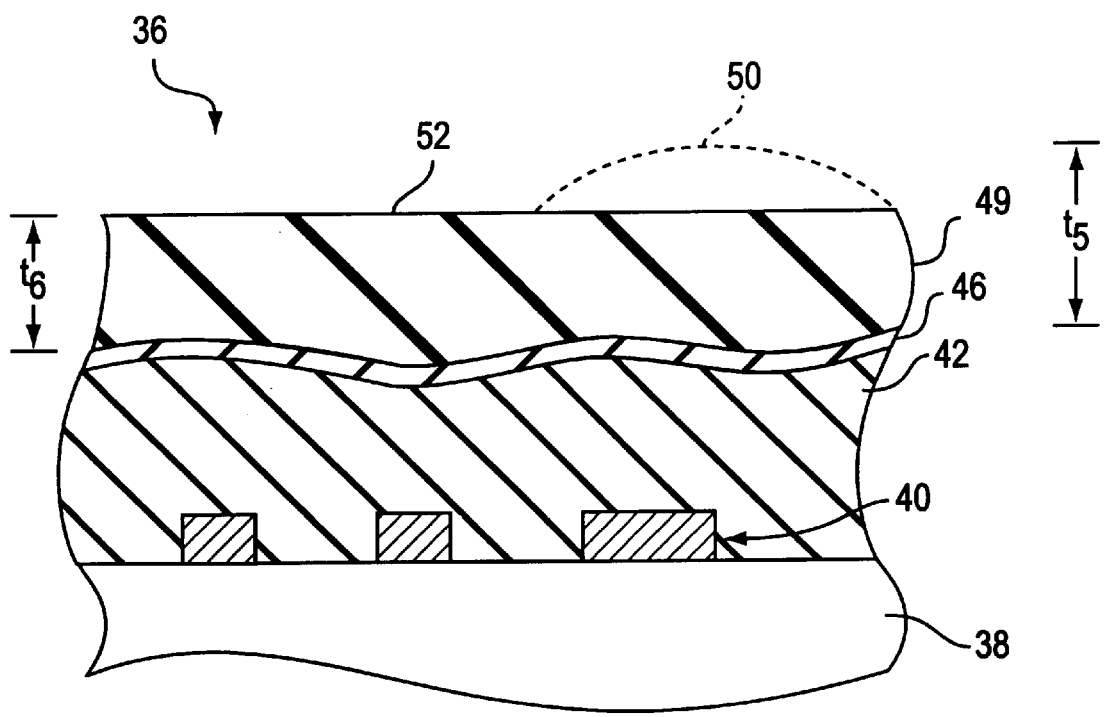
FIG. 5 is a cross-sectional view of the integrated circuit after chemical mechanical polishing (CMP).

FIG. 5 is a cross-sectional view of the integrated circuit 36 after CMP. After deposition of the $SiO_2$ skin 46, a cap layer 49 is deposited. Cap layer thickness $t_5$ as originally deposited typically ranges from about 5,000 to about 12,000 Angstroms. After the cap layer 49 has been deposited, the CMP process planarizes and polishes the cap layer 49 so that excess portion 50 of the cap layer 49 is removed, forming planar surface 52. The cap layer 49 adheres to the $SiO_2$ skin 46 and resists peeling because the methyl groups present in the methyl doped silicon oxide layer 42 are buffered from the cap layer 49 by the $SiO_2$ skin 46. After the CMP process, the cap layer thickness $t_6$, is about 2,000 to about 10,000 Angstroms, and preferably about 4,000 to about 5,000 Angstroms.

Figure 6:
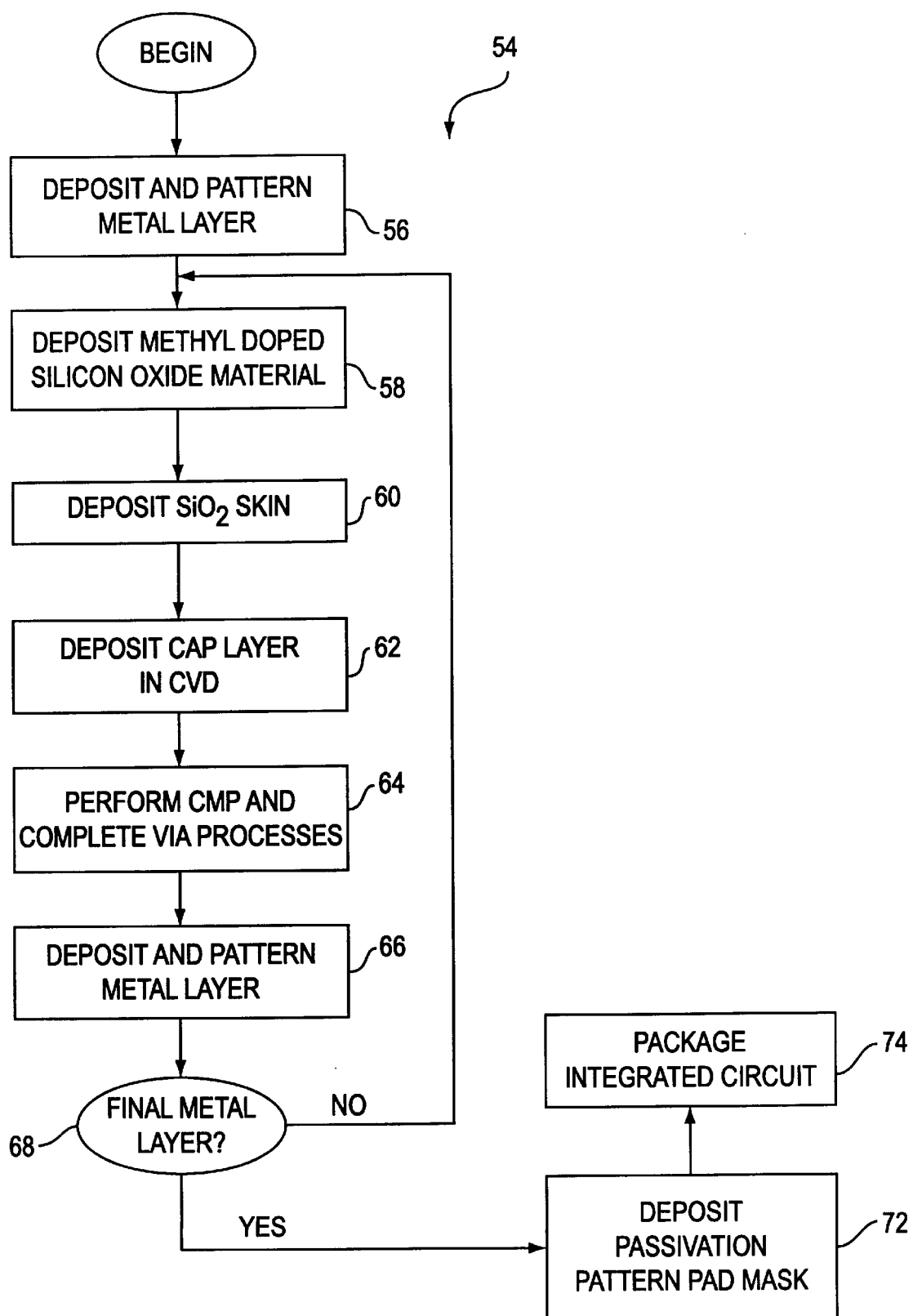
FIG. 6 is a flow chart of a method for improving adhesion of a cap layer to a methyl doped silicon oxide layer in accordance with the present invention.

The above described invention may be further understood with reference to a flow chart presented in FIG. 6. The flow chart encompasses a process 54 of making a semiconductor structure that improves adhesion of a cap layer to a methyl doped silicon oxide layer. The method 54 begins at an operation 56 where a metal layer is deposited and patterned onto the semiconductor substrate. The metal layer typically comprises of conductive metal traces. In an operation 58, a methyl doped silicon oxide layer is deposited onto the metal layer using chemical vapor deposition (CVD). Methyl doped silicon oxide material is used because it is a better insulator than the standard dielectric material and also because it resists cracking.

In an operation 60, a $SiO_2$ skin is deposited in the CVD tool by decreasing the volume of $CH_3SiH_3$ deposited, increasing the volume of $SiH_4$ deposited and keeping the volume of $H_2O_2$ deposited constant over a period of time. An operation 62 deposits a cap layer which adheres to the $SiO_2$ skin, thus allowing usage of methyl groups in the methyl doped silicon oxide layer. The methyl groups improve the insulating and crack resisting characteristics of the methyl doped silicon oxide layer.

An operation 64 performs CMP to planarize and polish the cap layer, and completes via processes. Next, an operation 66 deposits and patterns another metal layer. Operation 68 determines whether the process has deposited the final metal layer onto the semiconductor structure. If not, the method 54 proceeds back to operation 58. If the final metal layer has been deposited, an operation 72 deposits a passivation pattern pad mask, and a final operation 74 packages the integrated circuit.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A multi-layered integrated circuit structure made by the process comprising:
   depositing a methyl doped silicon oxide layer with a first thickness over a substrate under a first set of conditions;
   depositing a $SiO_2$ skin with a second thickness on said methyl doped silicon oxide layer under a second set of conditions wherein said second thickness is substantially thinner than said first thickness; and
   depositing a cap layer adhering on said $SiO_2$ skin under a third set of conditions.

2. A multi-layered integrated circuit structure as recited in claim 1 wherein said methyl group includes about 10% to about 25% methyl.

3. A multi-layered integrated circuit structure as recited in claim 1 wherein said methyl doped silicon oxide layer is preferably at least about 3,000 Angstroms in thickness.

4. A multi-layered integrated circuit structure as recited in claim 1 wherein said methyl doped silicon oxide layer is preferably in the range of about 3,000–5,000 Angstroms in thickness.

5. A multi-layered integrated circuit structure as recited in claim 1 wherein said $SiO_2$ skin is preferably in the range of about 50–1,000 Angstroms in thickness.

6. A multi-layered integrated circuit structure as recited in claim 5, wherein said $SiO_2$ skin is preferably in the range of about 200–600 Angstroms in thickness.

7. A multi-layered integrated circuit structure as recited in claim 6 wherein said $SiO_2$ skin is preferably about 400 Angstroms in thickness.

8. A multi-layered integrated circuit structure as recited in claim 1 wherein said cap layer is preferably in the range of about 2,000–10,000 Angstroms in thickness.

9. A multi-layered integrated circuit structure as recited in claim 8 wherein said cap layer is preferably in the range of about 4,000–5,000 Angstroms in thickness.

10. A multi-layered integrated circuit structure as recited in claim 1 wherein said methyl doped silicon oxide has a dielectric constant in the range of about 2.0–3.5.

11. A multi-layered integrated circuit structure as recited in claim 10 wherein said methyl doped silicon oxide has a dielectric constant of about 2.8.

12. A multi-layered integrated circuit structure comprising:
   a substrate;
   a methyl doped silicon oxide layer with a first thickness disposed over said substrate;
   a $SiO_2$ skin with a second thickness disposed over said methyl doped silicon oxide layer, wherein said second thickness is substantially less than said first thickness; and
   a cap layer disposed over said $SiO_2$ skin.

13. A multi-layered integrated circuit structure as recited in claim 12 wherein said methyl group is from the group $CH_3SiO_x$.

14. A multi-layered integrated circuit structure as recited in claim 12 wherein said methyl group includes about 10% to about 25% methyl.

15. A multi-layered integrated circuit structure as recited in claim 13 wherein the value x in said group $CH_3SiO_x$ is about 1.5 to about 1.9.

16. A multi-layered integrated circuit structure as recited in claim 12 wherein said methyl doped silicon oxide layer is disposed over a metal layer.

17. A multi-layered integrated circuit structure as recited in claim 12 wherein a surface of said cap layer is approximately planar.

18. A multi-layered integrated circuit structure as recited in claim 12 wherein said methyl doped silicon oxide layer is preferably at least about 3,000 Angstroms in thickness.

19. A multi-layered integrated circuit structure as recited in claim 18 wherein said methyl doped silicon oxide layer is preferably in the range of about 3,000–5,000 Angstroms in thickness.

20. A multi-layered integrated circuit structure as recited in claim 12 wherein said $SiO_2$ skin is preferably in the range of about 50–1,000 Angstroms in thickness.

21. A multi-layered integrated circuit structure as recited in claim 20 wherein said $SiO_2$ skin is preferably in the range of about 200–600 Angstroms in thickness.

22. A multi-layered integrated circuit structure as recited in claim 21 wherein said $SiO_2$ skin is preferably about 400 Angstroms in thickness.

23. A multi-layered integrated circuit structure as recited in claim 12 wherein said cap layer is preferably in the range of about 2,000–10,000 Angstroms in thickness.

24. A multi-layered integrated circuit structure as recited in claim 23 wherein said cap layer is preferably in the range of about 4,000–5,000 Angstroms in thickness.

25. A multi-layered integrated circuit structure as recited in claim 12 wherein said methyl doped silicon oxide has a dielectric constant in the range of about 2.0–3.5.

26. A multi-layered integrated circuit structure as recited in claim 25 wherein said methyl doped silicon oxide has a dielectric constant of about 2.8.

* * * * *